United States Patent
McLeod et al.

(10) Patent No.: US 9,960,295 B2
(45) Date of Patent: *May 1, 2018

(54) SINGLE-PHOTON AVALANCHE DIODE AND AN ARRAY THEREOF

(71) Applicants: STMICROELECTRONICS (RESEARCH & DEVELOPMENT) LIMITED, Marlow Bucks (GB); STMICROELECTRONICS (GRENOBLE 2) SAS, Grenoble (FR)

(72) Inventors: Stuart McLeod, Edinburgh (GB); Pascal Mellot, Lans en Vercors (FR); Lindsay Grant, Edinburgh (GB)

(73) Assignees: STMICROELECTRONICS (GRENOBLE 2) SAS, Grenoble (FR); STMICROELECTRONICS (RESEARCH & DEVELOPMENT) LIMITED, Buckinghamshire (GB)

( * ) Notice: Subject to any disclaimer, the term of this patent is extended or adjusted under 35 U.S.C. 154(b) by 181 days.

This patent is subject to a terminal disclaimer.

(21) Appl. No.: 14/781,333

(22) PCT Filed: Jun. 20, 2014

(86) PCT No.: PCT/GB2014/051895
§ 371 (c)(1),
(2) Date: Sep. 30, 2015

(87) PCT Pub. No.: WO2014/202995
PCT Pub. Date: Dec. 24, 2014

(65) Prior Publication Data
US 2016/0056185 A1    Feb. 25, 2016

(30) Foreign Application Priority Data
Jun. 21, 2013 (GB) .................................. 1311055.6

(51) Int. Cl.
*H01J 40/14* (2006.01)
*H01L 31/0232* (2014.01)
(Continued)

(52) U.S. Cl.
CPC ...... *H01L 31/02327* (2013.01); *G01J 1/4228* (2013.01); *G01J 1/44* (2013.01);
(Continued)

(58) Field of Classification Search
CPC ............. H01L 27/14623; H01L 31/107; H01L 27/14818; H01L 29/66113;
(Continued)

(56) References Cited

U.S. PATENT DOCUMENTS 4,078,243 A    3/1978  De Bar et al.
9,728,659 B2*  8/2017  Hirigoyen ......... H01L 31/02327
(Continued)

FOREIGN PATENT DOCUMENTS

EP    1679749 A1    7/2006
EP    1840967 A1    10/2007
(Continued)

OTHER PUBLICATIONS

Rochas et al., Single Photon Detector Fabricated in a Complementary Metal-Oxide-Semiconductor High-Voltage Technology, Review of Scientific Instruments, vol. 74, No. 7, Jul. 2003, pp. 3263-3270.

*Primary Examiner* — Thanh Luu
(74) *Attorney, Agent, or Firm* — Slater Matsil, LLP

(57) ABSTRACT

A Single-Photon Avalanche Diode (SPAD) is disclosed. The SPAD may include an active region for detection of incident radiation, and a cover configured to shield part of the active region from the incident radiation. An array is also disclosed (Continued)

and includes SPADs arranged in rows and columns. A method for making the SPAD is also disclosed.

34 Claims, 5 Drawing Sheets

(51) Int. Cl.
| | |
|---|---|
| *H01L 27/146* | (2006.01) |
| *G01T 1/24* | (2006.01) |
| *H01L 31/02* | (2006.01) |
| *H01L 31/0216* | (2014.01) |
| *H01L 31/107* | (2006.01) |
| *G01J 1/42* | (2006.01) |
| *G01J 1/44* | (2006.01) |
| *H01L 27/144* | (2006.01) |
| *H01L 31/18* | (2006.01) |
| *H01L 27/148* | (2006.01) |

(52) U.S. Cl.
CPC .......... *G01T 1/248* (2013.01); *H01L 27/1443* (2013.01); *H01L 27/1446* (2013.01); *H01L 27/1461* (2013.01); *H01L 27/14603* (2013.01); *H01L 27/14609* (2013.01); *H01L 27/14623* (2013.01); *H01L 27/14625* (2013.01); *H01L 27/14636* (2013.01); *H01L 27/14643* (2013.01); *H01L 31/02027* (2013.01); *H01L 31/02164* (2013.01); *H01L 31/107* (2013.01); *H01L 31/18* (2013.01); *H01L 27/14818* (2013.01)

(58) Field of Classification Search
CPC .......... H01L 31/02162; H04N 5/35563; G01J 2001/444; G01J 2001/4466
See application file for complete search history.

(56) References Cited

U.S. PATENT DOCUMENTS

| | | |
|---|---|---|
| 2003/0160250 A1 | 8/2003 | Cova et al. |
| 2004/0132262 A1 | 7/2004 | Ayabe et al. |
| 2005/0256349 A1 | 11/2005 | Matsuyama et al. |
| 2008/0075474 A1 | 3/2008 | Kawai |
| 2008/0237769 A1 | 10/2008 | Okihara |
| 2009/0184384 A1* | 7/2009 | Sanfilippo ......... H01L 27/14643 257/432 |
| 2011/0169117 A1 | 7/2011 | McIntosh et al. |
| 2012/0205522 A1* | 8/2012 | Richardson ............ H04N 5/355 250/214.1 |
| 2012/0262606 A1* | 10/2012 | Yagyu .................. H04N 5/2621 348/239 |
| 2014/0104474 A1 | 4/2014 | Tange et al. |
| 2015/0293021 A1 | 10/2015 | Finkelstein et al. |
| 2016/0064579 A1 | 3/2016 | Hirigoyen |

FOREIGN PATENT DOCUMENTS

| | | |
|---|---|---|
| EP | 2040308 A1 | 3/2009 |
| JP | 63-058977 | 3/1988 |
| JP | 6358977 | 4/1988 |
| JP | 2010056173 A | 3/2010 |

* cited by examiner

SINGLE-PHOTON AVALANCHE DIODE AND AN ARRAY THEREOF

RELATED APPLICATION

This application is based upon prior filed Application No. PCT/GB2014/051895, filed Jun. 20, 2014, the entire subject matter of which is incorporated herein by reference in its entirety.

TECHNICAL FIELD

This application relates to Single-Photon Avalanche Diodes (SPADs), and, in particular to, SPADs usable in ambient light sensing and ranging applications.

BACKGROUND

A SPAD is based on a p-n junction device biased beyond its breakdown region. The high reverse bias voltage generates a sufficient magnitude of electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by way of a single incident photon striking the high field region. It is this feature which gives rise to the name "Single Photon Avalanche Diode". This single photon detection mode of operation is often referred to as "Geiger Mode".

Single photon counting devices output response to incident light intensity becomes significantly non-linear as intensity increases. This may be problematic for many applications, such as ambient light sensing and ranging. It may be desirable to provide a SPAD and/or SPAD array with a better linear output response to illumination levels.

SUMMARY

A SPAD is disclosed. The SPAD may include an active region for detection of incident radiation, and a cover configured to shield part of the active region from the incident radiation. An array is also disclosed and includes SPADs arranged in rows and columns. A method for making the SPAD is also disclosed.

BRIEF DESCRIPTION OF THE DRAWINGS

Embodiments of the present disclosure will now be described, by way of example only, by reference to the accompanying drawings, in which.

DETAILED DESCRIPTION

Figure 1:
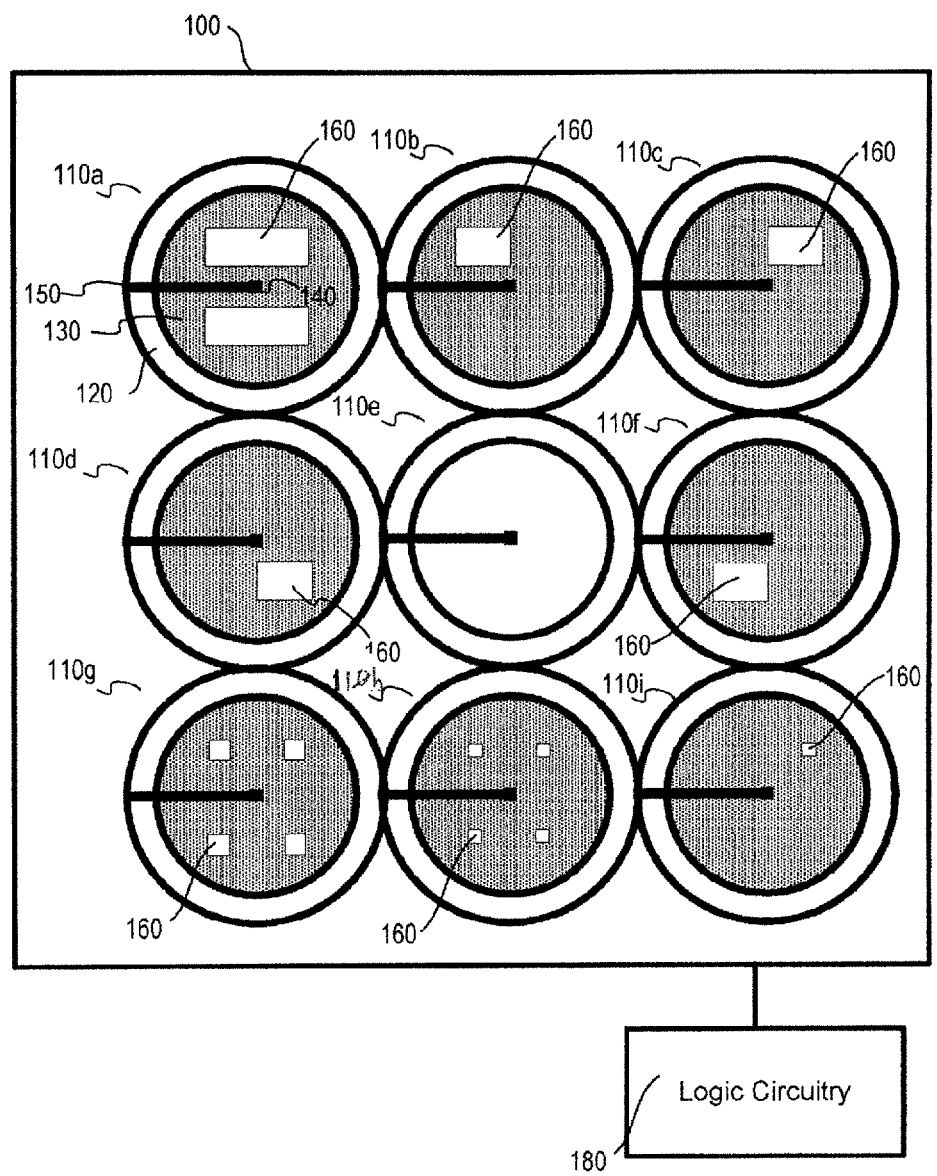
FIG. 1 shows a schematic top plan view of an array of SPADs, each SPAD having a different attenuation profile, according to the present disclosure.

An avalanche is triggered when reverse biasing a PN-junction to around the breakdown voltage. This effect can be used in two modes of operation. Commonly, the avalanche photodiodes are biased just below the breakdown voltage, the photocurrent remaining proportional to the incoming light intensity. Gain values of a few hundred are obtained in III-V semiconductors as well as in silicon.

SPADs are solid-state photo detectors which utilize the fact that p-n diodes can be stable for a finite time above their breakdown voltage. When an incident photon with sufficient energy to liberate an electron arrives, avalanche multiplication of the photo-generated electron occurs due to the high electric field. This produces a measurable current pulse signaling the arrival of the photon which negates the need for amplification due to the internal gain of the device.

Essentially SPADs are photodiodes that are biased above the breakdown voltage in the so-called Geiger mode. This mode of operation requires the introduction of a quenching mechanism to stop the avalanche process. Each incoming photon results in a strong current pulse of few nanoseconds duration. The device works as an optical Geiger counter.

Quenching is required to stop the avalanche process, which is done by reducing the SPAD's reverse bias below its breakdown voltage. The simplest quenching circuit is commonly referred to as passive quenching. Usually, passive quenching is simply performed by providing a resistance in series to the SPAD. The avalanche current self-quenches simply because it develops a voltage drop across the resistance (a high-value ballast load), reducing the voltage across the SPAD to below its breakdown voltage. After the quenching of the avalanche current, the SPAD's bias slowly recovers to at or above the breakdown voltage and the detector is ready to be triggered again.

An alternative to passive quenching is active quenching. There are a number of different active quenching arrangements, although in general active quenching refers to detection of a breakdown event by some subsequent digital logic connected to the SPAD output, and actively pulling the SPAD moving node to a voltage below breakdown, quenching the avalanche. Active quenching is desirable for several reasons, including a reduction in dead time, and improved photon counting rate at high light levels enabling a dynamic range extension. Active quenching is essential in many applications of SPAD technology.

Dead time is the time interval after detection of a photon, during which it is quenched and returned to its active state. During this time, no photons are detected by the SPAD. While actively quenching the SPAD will bring it to its active state more quickly after a detection event than with passive quenching, under high light levels (with many detection events), the SPAD can still spend a large fraction of its time inactive. This can lead to saturation and reduction in the number of photons detected by the SPAD. The result of this is that the SPAD output does not track the light level linearly, which causes problems in some applications. By the nature of their design, SPADs have no gain control mechanism to address this problem. It is proposed therefore, to attenuate the SPAD to improve output linearity.

FIG. 1 shows a SPAD array 100 coupled to logic circuitry 180. Shown are nine SPADs 110a-110i. Each SPAD comprises a guard ring region 120, a breakdown region 130, an anode 140, and a track area 150 for connection to the anode. Only photons incident on the breakdown region are detected. The breakdown region is shielded by the anode and the track area reducing its active area. Taking one specific, non-limiting, example, the SPAD may have an effective active area of 48.05 $\mu m^2$.

Attenuation may be achieved by further reducing the SPAD's active area. This may be done by covering more of the breakdown region with a non-transmissive cover, which acts to block any photons incident on the cover surface. One way of doing this is to cover part of the breakdown region with a metal layer when forming the metal track and anode. The metal layer may completely cover the active area, except for one or more apertures 160. In this way, the only photons detected by the SPAD are those which pass through the aperture and onto the SPAD's active area.

In FIG. 1, one SPAD 110e is shown uncovered as is conventional. The remaining SPADs are shown with their active areas covered, the covers having various aperture 160 configurations, thereby providing varying degrees of attenuation. The cover of SPAD 110a has two apertures 160 providing 1/1.73 area attenuation. SPADs 110b, 110c, 110d, 110f, 110g all have covers with aperture 160 arrangements providing 1/7.3 attenuation. SPADs 110b, 110c, 110d, 110f all have a single aperture located in a different quadrant of the active area of the SPAD, while SPAD 110g has four apertures that are each quarter of the size than that of SPADs 110b, 110c, 110d, 110f. SPAD 110h has four apertures, each of which provides an attenuation of 1/117, thereby providing a total attenuation of 1/29.3. SPAD 110i has only one aperture, which provides an attenuation of 1/117. This particular SPAD array arrangement is shown to illustrate the effect of different attenuation levels.

The effect of the attenuation is to reduce the number of photons detected by the SPAD. In doing this, the SPAD does not need to be reset so often, and therefore the likelihood is reduced, of a photon arriving during a SPAD reset following a previous detection event. Consequently, fewer photons are missed by the SPAD, and linearity is maintained at higher incident light levels. This results in a more linear output response to light intensity.

Figure 2A:
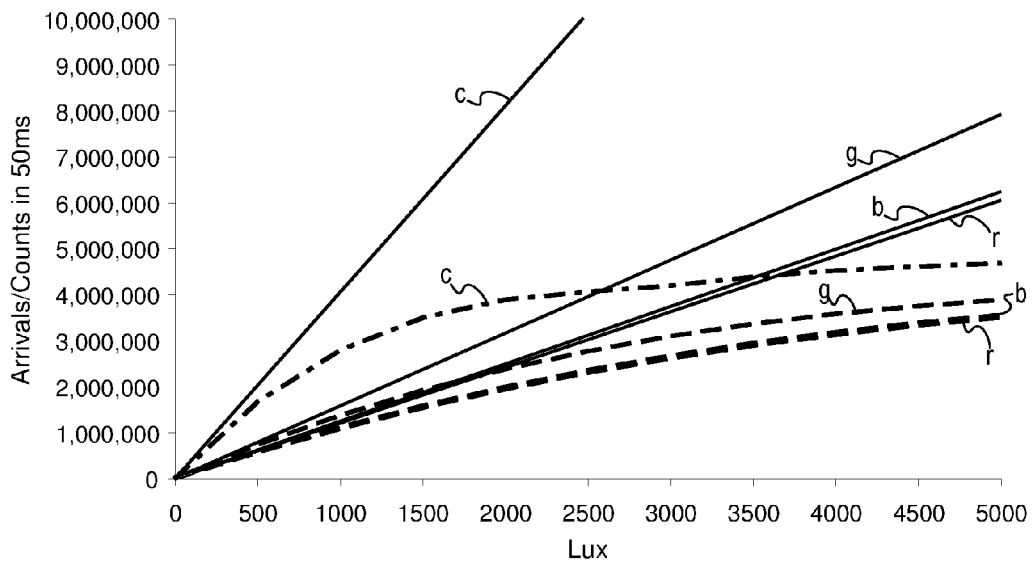
FIG. 2a is a diagram of the number of photon arrivals in 50 ms (solid lines) and the number of photon counts recorded in 50 ms (dashed lines), against light intensity for unfiltered SPADs, and for SPADs having red, green and blue filters with no attenuation, according to the present disclosure.

FIG. 2a is a plot of the number of photon arrivals in 50 ms (solid lines) and the number of photon counts recorded in 50 ms (dashed lines), against light intensity for clear c, red r, green g and blue b SPADs with no attenuation. The counts are given for a 50 ms worst case for flicker immunity. The plot shown is for 6500K CCT illumination. The plot shows significant non-linearity with a large number of missed photons even at 500 lux for the clear SPAD. Green, red and blue are all significantly affected above 1000 lux. In this example clear SPADs have no optical filter, whereas red, green and blue SPADs have optical filters which pass red, green and blue light respectively. Attenuation resultant from the optical filters is discounted when describing a SPAD as having no attenuation.

Figure 2B:
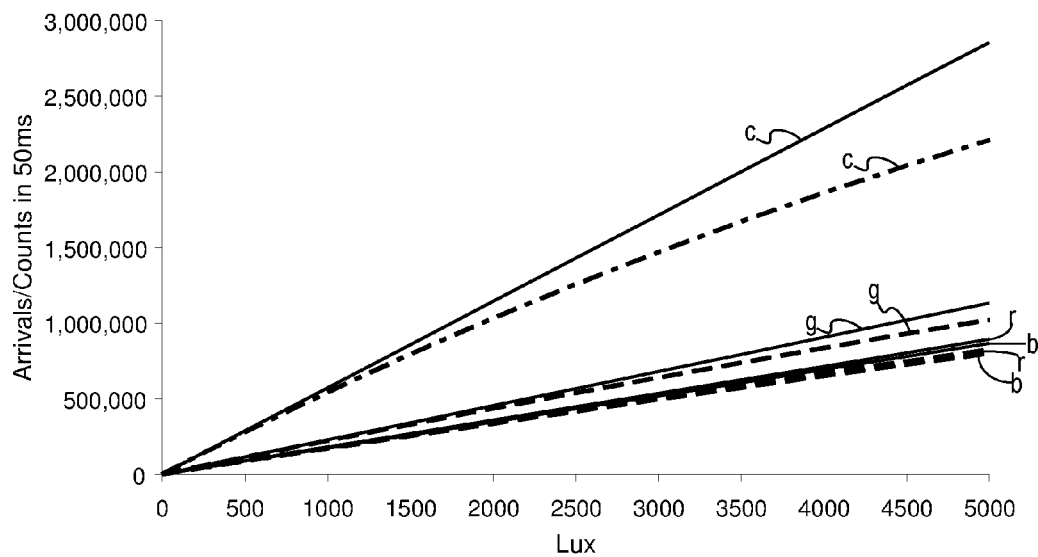
FIG. 2b is a diagram of the number of photon arrivals in 50 ms (solid lines) and the number of photon counts recorded in 50 ms (dashed lines), against light intensity for unfiltered SPADs, and for SPADs having red, green and blue filters with 1/1.73× attenuation, according to the present disclosure.
Figure 2C:
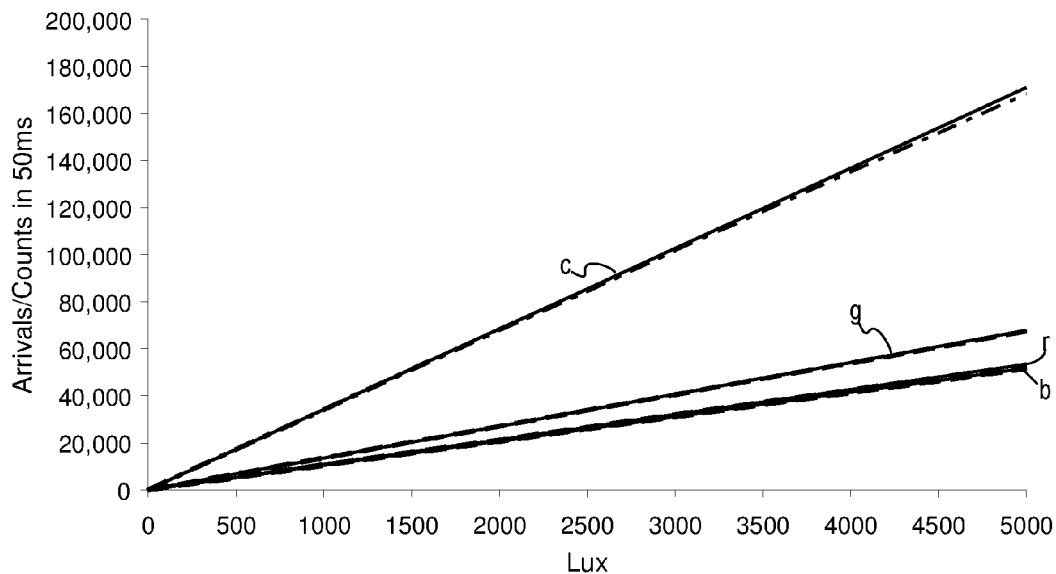
FIG. 2c is a diagram of the number of photon arrivals in 50 ms (solid lines) and the number of photon counts recorded in 50 ms (dashed lines), against light intensity for unfiltered SPADs, and for SPADs having red, green and blue filters with 1/117× attenuation, according to the present disclosure.

FIG. 2b shows a similar graph to that of FIG. 2a, but for SPADs having covers providing 1/1.73× attenuation. It shows significantly reduced non-linearity compared to SPADs having no attenuation. The output is essentially linear up to 1000 lux for clear SPADs and up to 2500 lux for red/green/blue SPADs. FIG. 2c shows that same graph for 1/117× attenuated SPADs. Non-linearity is greatly reduced for all channels in this case, with the plots for photon arrivals and photon counts largely overlapping, illustrating a linear response.

Figure 3A:
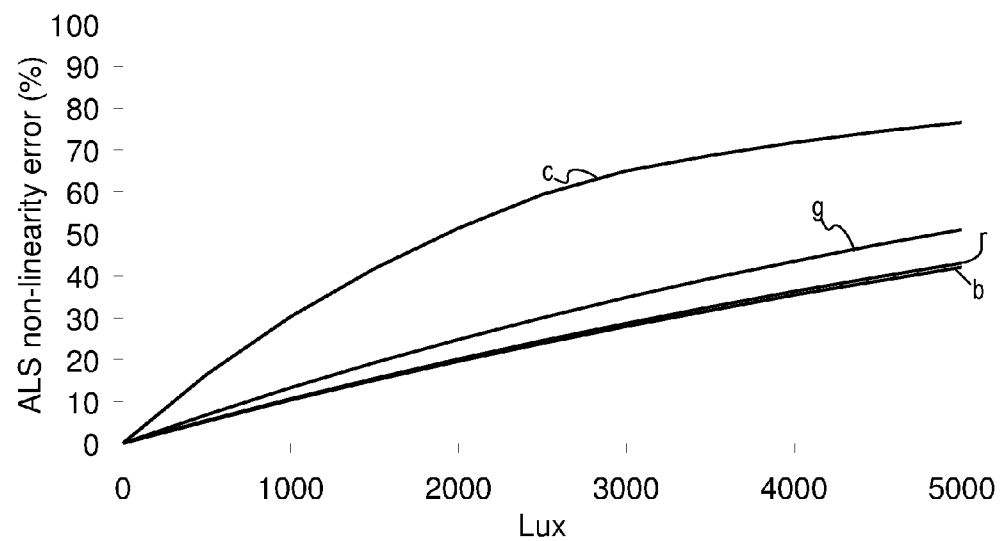
FIG. 3a is a diagram of the non-linearity error against light intensity for unfiltered SPADs, and for SPADs having red, green and blue filters with no attenuation, according to the present disclosure.
Figure 3B:
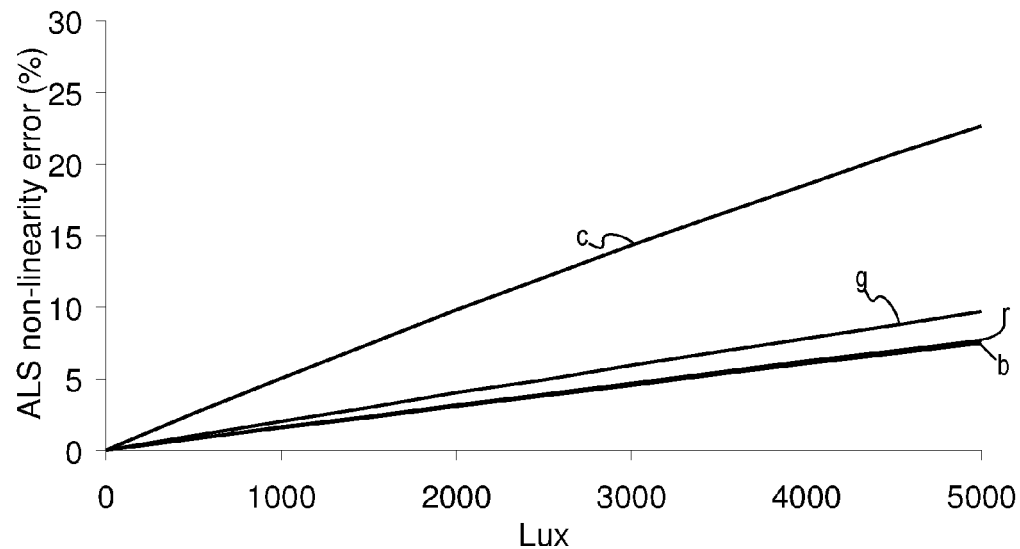
FIG. 3b is a diagram of the non-linearity error against light intensity for unfiltered SPADs, and for SPADs having red, green and blue filters with 1/1.73× attenuation, according to the present disclosure.
Figure 3C:
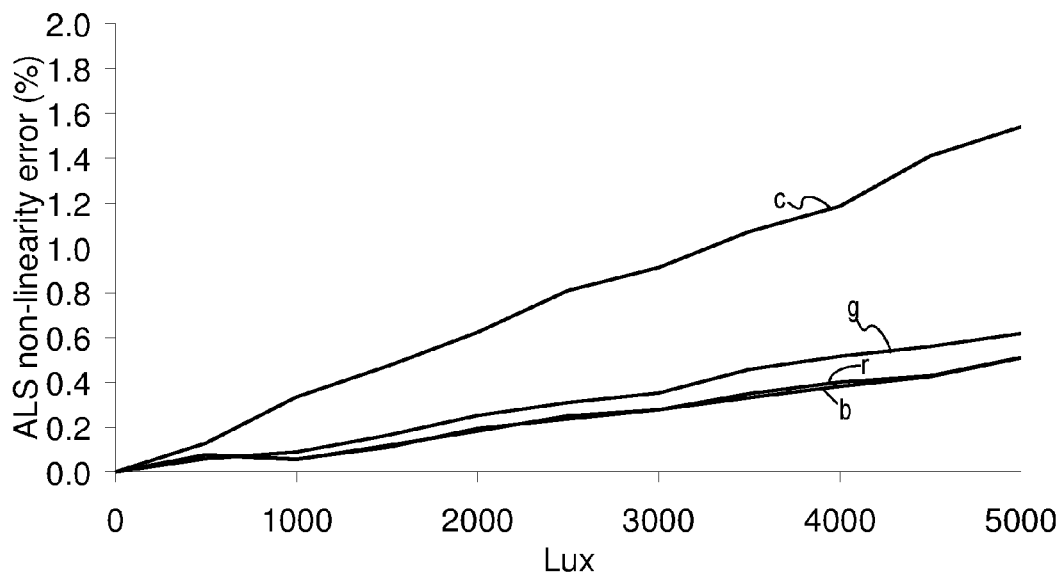
FIG. 3c is a diagram of the non-linearity error against light intensity for unfiltered SPADs, and for SPADs having red, green and blue filters with 1/117× attenuation, according to the present disclosure.
Figure 4:
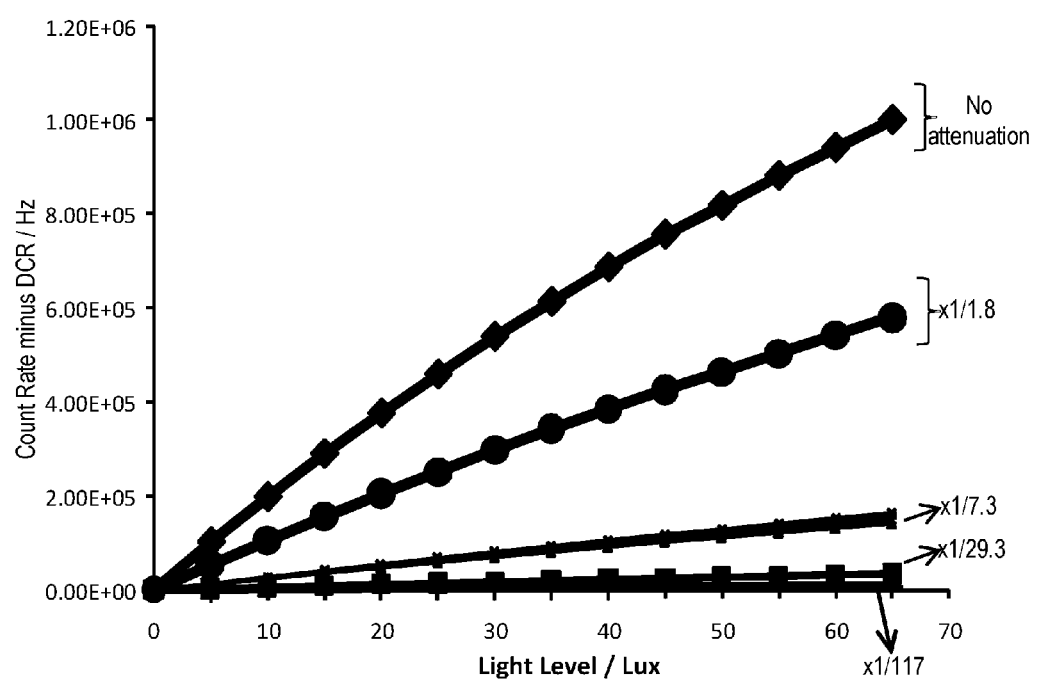
FIG. 4 is a diagram of count rate (minus dark rate count) against light intensity for SPADs attenuated with varying aperture sizes, according to the present disclosure.

FIGS. 3a-3c show a plot of the non-linearity error against light intensity for clear c, red r, green g and blue b SPADs, with no attenuation, 1/1.73× attenuation, and 1/117× attenuation respectively. It can be seen that 1/117× attenuation results in a non-linearity error of less than 1% (up to 5 klux) for red, green and blue SPADs; and a non-linearity error of less than 2% (up to 5 klux) for clear SPADs. FIG. 4 shows a graph of count rate (corrected for the dark rate count) against light intensity for SPADs attenuated with varying aperture sizes. It can be seen that the area aperture attenuations match actual area reductions.

In practical applications, the SPADs disclosed herein will be arranged in arrays. The attenuation levels chosen for particular arrays of SPADs will depend on the specific application, the likely illumination conditions and the acceptable level of non-linearity. For example, if the SPAD array is always likely to be used in situations where illumination levels are high, then an array of SPADs all having high attenuation (such as 1/117× attenuation) may be suitable. However, should illumination levels then fall, the detection rate may fall close to zero.

Consequently, for many practical applications, an array of SPADs with different attenuation levels may be advantageous. This allows an acceptably linear output to be achievable in a wide range of light conditions. In one embodiment, an array may comprise banks of SPADs, one or more having no attenuation, one or more having lesser attenuation (for example 1/1.73× attenuation) and one or more having greater attenuation (for example 1/117× attenuation). In very low light levels (less than 500 lux as illustrated in FIG. 2a), the unattenuated SPADs will provide a suitably linear response. At medium light levels, the output from the 1/1.73× attenuated SPADs should be selected. At the highest light levels, the outputs of the 1/117× attenuated SPADs should be selected.

Suitable logic 180 may be provided to select the appropriate SPAD outputs depending on illumination conditions. There are a number of different ways such logic 180 may be implemented. For example, the outputs of particular banks (having particular attenuation levels) may be selected if their count rate is measured to be over a certain lower threshold level, or between upper and lower threshold levels.

It should be appreciated that the above description is for illustration only and other embodiments and variations may be envisaged without departing from the spirit and scope of the present disclosure. In particular, the specific levels of attenuation may be varied from those illustrated. SPADs according to the concepts described herein may have, depending on the embodiment, over 40% over 50%, over 75%, over 85%, over 95% or over 99% of the active area covered/shielded. Arrays may comprise any combination of such SPADs.

The invention claimed is:

1. An array of Single-Photon Avalanche Diodes (SPADs), the array comprising:
   a plurality of SPADs arranged in rows and columns, each SPAD comprising
      an active region for detection of incident radiation, the active region having a central region surrounded by a periphery,
      a guard ring disposed around the periphery of the active region,
      a cover configured to shield part of said active region from the incident radiation, and
      an anode disposed over and overlapping with the central region of the active region along a direction normal to a major surface of the active region, the anode being coupled to said active region;
   said plurality of SPADs comprising a plurality of different subsets of SPADs, each different subset having at least one SPAD therein with a different proportion of respective active regions shielded by respective covers; and
   logic circuitry configured to select from a different subset of SPADs from said plurality thereof based upon incident radiation intensity.

2. The array of SPADs of claim 1 wherein said cover comprises a material non-transmissive to incident photons.

3. The array of SPADs of claim 1 wherein said cover comprises at least one aperture configured to expose a portion of said active region.

4. The array of SPADs of claim 1 wherein each SPAD comprises electrical connections coupled to said anode; and wherein said cover comprises a same material as said anode and said electrical connections.

5. The array of SPADs of claim 1 wherein said plurality of different subsets of SPADs comprises a first subset of SPADs with respective covers configured to shield less than or equal to 25% of respective active regions.

6. The array of SPADs of claim 1 wherein said plurality of different subsets of SPADs comprises a second subset of SPADs with respective covers configured to shield between 40-95% of respective active regions.

7. The array of SPADs of claim 1 wherein said plurality of different subsets of SPADs comprises a third subset of SPADs with respective covers configured to shield between 75-95% of respective active regions.

8. The array of SPADs of claim 1 wherein said plurality of different subsets of SPADs comprises a fourth subset of SPADs with respective covers configured to shield greater than or equal to 95% of respective active regions.

9. The array of SPADs of claim 1 wherein said plurality of different subsets of SPADs comprises a fifth subset of SPADs with respective covers configured to shield greater than or equal to 98% of respective active regions.

10. The array of SPADs of claim 1 wherein said plurality of different subsets of SPADs comprises a sixth subset of SPADs with respective covers configured to shield less than or equal to 1% of respective active regions.

11. A method for making an array of Single-Photon Avalanche Diodes (SPADs), the method comprising:
   forming a plurality of SPADs arranged in rows and columns, each SPAD comprising
      an active region for detection of incident radiation, the active region having a central region surrounded by a periphery,
      a guard ring disposed around the periphery of the active region, and
      a cover configured to shield part of the active region from the incident radiation, and
      an anode disposed over and overlapping with the central region of the active region along a direction normal to a major surface of the active region, the anode being coupled to said active region;
   the plurality of SPADs comprising a plurality of different subsets of SPADs, each different subset having at least one SPAD therein with a different proportion of respective active regions shielded by respective covers; and
   providing logic circuitry to select from a different subset of SPADs from the plurality thereof based upon incident radiation intensity.

12. The method of claim 11 wherein the cover is formed during a same process as an anode and electrical connection of each SPAD.

13. The method of claim 11 wherein the cover comprises a material non-transmissive to incident photons.

14. The method of claim 11 wherein the cover comprises at least one aperture configured to expose a portion of the active region.

15. The method of claim 11 wherein each SPAD comprises electrical connections coupled to the anode; and wherein the cover comprises a same material as the anode and the electrical connections.

16. The method of claim 11 wherein the plurality of different subsets of SPADs comprises a first subset of SPADs with respective covers configured to shield less than or equal to 25% of respective active regions.

17. The method of claim 11 wherein the plurality of different subsets of SPADs comprises a second subset of SPADs with respective covers configured to shield between 40-95% of respective active regions.

18. The method of claim 11 wherein the plurality of different subsets of SPADs comprises a third subset of SPADs with respective covers configured to shield between 75-95% of respective active regions.

19. The method of claim 11 wherein the plurality of different subsets of SPADs comprises a fourth subset of SPADs with respective covers configured to shield greater than or equal to 95% of respective active regions.

20. The method of claim 11 wherein the plurality of different subsets of SPADs comprises a fifth subset of SPADs with respective covers configured to shield greater than or equal to 98% of respective active regions.

21. The method of claim 11 wherein the plurality of different subsets of SPADs comprises a sixth subset of SPADs with respective covers configured to shield less than or equal to 1% of respective active regions.

22. An array of Single-Photon Avalanche Diodes (SPADs) comprising:
   a first SPAD comprising
      a first diode region disposed in a substrate,
      a first guard ring disposed around the first diode region,
      a first anode disposed over the first diode region,
      a first cover disposed over and overlapping with the first diode region, and
      a first aperture disposed in the first cover, the first aperture exposing a portion of the first diode region, wherein the first aperture is located in a first location relative to the first diode region in a first reference coordinate system; and
   a second SPAD disposed adjacent the first SPAD, the second SPAD comprising
      a second diode region disposed in the substrate, a second guard ring disposed around the second diode region,
a second anode disposed over the second diode region,
a second cover disposed over and overlapping with the second diode region, and
a second aperture disposed in the second cover, the second aperture exposing a portion of the second diode region, wherein the second aperture is located in a second location relative to the second diode region in a second reference coordinate system, wherein coordinates axes of the first reference coordinate system are parallel to corresponding coordinate axes of the second reference coordinate system, wherein the first location is different from the second location such that the first SPAD has a different structure than the second SPAD.

23. The array of SPADs of claim 22 further comprising logic circuitry configured to select the first SPAD or the second SPAD based upon incident radiation intensity.

24. The array of SPADs of claim 22 wherein a size of the first aperture is different from a size of the second aperture.

25. The array of SPADs of claim 22 further comprising a third aperture disposed in the first cover, the third aperture exposing a portion of the first diode region, wherein the third aperture is located in a third location relative to the first diode region, wherein the first location is different from the third location.

26. The array of SPADs of claim 22 wherein the first anode and the first cover comprise a material.

27. The array of SPADs of claim 22 further comprising:
a third SPAD disposed adjacent the first SPAD, the third SPAD comprising
a third diode region disposed in the substrate,
a third guard ring disposed around the third diode region,
a third anode disposed over the third diode region, wherein the third SPAD does not include a cover over and overlapping with the third diode region.

28. An array of Single-Photon Avalanche Diodes (SPADs) comprising:
a first SPAD comprising
a first diode region disposed in a substrate,
a first guard ring disposed around the first diode region,
a first anode disposed over the first diode region,
a first cover disposed over and overlapping with the first diode region,
a first aperture disposed in the first cover, the first aperture exposing a first portion of the first diode region, wherein the first aperture is located in a first location with respect to the first diode region,
a second aperture disposed in the first cover, the second aperture exposing a second portion of the first diode region, wherein the second aperture is located in a second location with respect to the first diode region, wherein the first location is different from the second location.

29. The array of SPADs of claim 28 further comprising:
a second SPAD disposed adjacent the first SPAD, the second SPAD comprising
a second diode region disposed in the substrate,
a second guard ring disposed around the second diode region,
a second anode disposed over the second diode region, wherein the second SPAD does not include a cover over and overlapping with the second diode region.

30. The array of SPADs of claim 28 wherein a size of the first aperture is same as a size of the second aperture.

31. The array of SPADs of claim 28 further comprising
a second SPAD disposed adjacent the first SPAD, the second SPAD comprising
a second diode region disposed in the substrate,
a second guard ring disposed around the second diode region,
a second anode disposed over the second diode region,
a second cover disposed over and overlapping with the second diode region,
a third aperture disposed in the second cover, the third aperture exposing a third portion of the second diode region, wherein the third aperture is located in a third location with respect to the second diode region,
a fourth aperture disposed in the second cover, the fourth aperture exposing a fourth portion of the second diode region, wherein the fourth aperture is located in a fourth location with respect to the second diode region, wherein the third location is different from the fourth location.

32. The array of SPADs of claim 31 wherein a size of the first aperture is different from a size of the third aperture.

33. The array of SPADs of claim 31 further comprising logic circuitry configured to select the first SPAD or the second SPAD based upon incident radiation intensity.

34. The array of SPADs of claim 28 wherein the first anode and the first cover comprise a material.

* * * * *